US011196391B2

(12) United States Patent
Staudinger et al.

(10) Patent No.: US 11,196,391 B2
(45) Date of Patent: Dec. 7, 2021

(54) TEMPERATURE COMPENSATION CIRCUIT AND TEMPERATURE COMPENSATED AMPLIFIER CIRCUIT

(71) Applicant: NXP USA, Inc., Austin, TX (US)

(72) Inventors: Joseph Staudinger, Gilbert, AZ (US); Yu You, Chandler, AZ (US); Donald Vernon Hayes, Scottsdale, AZ (US)

(73) Assignee: NXP USA, Inc., Austin, TX (US)

( * ) Notice: Subject to any disclaimer, the term of this patent is extended or adjusted under 35 U.S.C. 154(b) by 119 days.

(21) Appl. No.: 16/528,536

(22) Filed: Jul. 31, 2019

(65) Prior Publication Data
US 2021/0036663 A1 Feb. 4, 2021

(51) Int. Cl.
*H03F 1/30* (2006.01)
*H03F 3/04* (2006.01)

(52) U.S. Cl.
CPC .............. *H03F 1/302* (2013.01); *H03F 3/04* (2013.01); *H03F 1/301* (2013.01); *H03F 2200/447* (2013.01)

(58) Field of Classification Search
CPC ...... H03F 1/302; H03F 3/04; H03F 2200/447; H03F 2200/451; H03F 3/19; H03F 2200/21; H03F 1/30
USPC ...................................... 330/296, 289, 207 P
See application file for complete search history.

(56) References Cited

U.S. PATENT DOCUMENTS

| 7,019,508 | B2 | 3/2006 | Rategh et al. | |
|---|---|---|---|---|
| 7,345,547 | B2 | 3/2008 | Wang et al. | |
| 7,876,157 | B1 * | 1/2011 | Kang | H03F 1/0261 330/285 |
| 9,041,473 | B2 | 5/2015 | Fujiwara et al. | |
| 2012/0032744 | A1 * | 2/2012 | Maki | H03F 1/3205 330/296 |

FOREIGN PATENT DOCUMENTS

| CN | 101394152 B | 8/2010 |
|---|---|---|
| JP | H04167463 A | 6/1992 |

OTHER PUBLICATIONS

Järvinen, Esko et al. "Bias Circuits for GaAs HBT Power Amplifiers", IEEE MTT-S Digest, pp. 507-510, 2001.

Chang, Wei-Ling et al. "Temperature Insensitive PA Bias Circuit with Digital Control Interface Using InGaP/GaAs HBT Technology", Proceedings of the 45th European Microwave Conference, Sep. 7-10, 2015, pp. 1283-1286, 2015.

(Continued)

*Primary Examiner* — Khanh V Nguyen
*Assistant Examiner* — Khiem D Nguyen (57) ABSTRACT

Embodiments of a temperature compensation circuit and a temperature compensated amplifier circuit are disclosed. In an embodiment, a temperature compensation circuit includes a bias reference circuit having serially connected transistor devices and a driver transistor device connected to the bias reference circuit. At least one of the serially connected transistor devices includes a resistor connected between two terminals of the at least one of the serially connected transistor devices. The driver transistor device is configured to generate a drive current based on a resistance value of the resistor.

19 Claims, 3 Drawing Sheets

(56) References Cited

OTHER PUBLICATIONS

Shulin, Zhang et al; "A fully integrated, highly linear SiGe BiCMOS class-AB power amplifier targeting 2.4GHz applications"; 2010 Asia Pacific Conf. on Postgraduate Research in Microelectronics and Electronics; IEEE, Piscataway, NJ, USA pp. 275-278 (Sep. 22, 2010).

Ruan, Ying et al; "A Fully Integrated SiGe BiCMOS Power Amplifier for 2.4GHz Wireless-LAN Application"; Int'l Conference on Communications Networking and Mobile Computing; IEEE, Piscataway, NJ, USA; 4 pages (Sep. 23, 2010).

\* cited by examiner

TEMPERATURE COMPENSATION CIRCUIT AND TEMPERATURE COMPENSATED AMPLIFIER CIRCUIT

BACKGROUND

Temperature fluctuations can affect the operation of a circuit. For example, a gain variation of an amplifier can be caused by temperature fluctuations. However, different applications require compensation for the variations of one or more operating parameters caused by temperature fluctuations in different temperature ranges and with different compensation levels. Therefore, there is a need for a temperature compensation circuit that can be used for temperature compensation with various compensation levels across a wide temperature range.

SUMMARY

Embodiments of a temperature compensation circuit and a temperature compensated amplifier circuit are disclosed. In an embodiment, a temperature compensation circuit includes a bias reference circuit having serially connected transistor devices and a driver transistor device connected to the bias reference circuit. At least one of the serially connected transistor devices includes a resistor connected between two terminals of the at least one of the serially connected transistor devices. The driver transistor device is configured to generate a drive current based on a resistance value of the resistor. Other embodiments are also described.

In an embodiment, the at least one of the serially connected transistor devices includes a bipolar junction transistor (BJT), and the resistor is connected between a base terminal of the BJT and a collector terminal of the BJT.

In an embodiment, the bias reference circuit further includes a controller configured to control a resistance value of the resistor based on an operating temperature.

In an embodiment, the controller is further configured to control the resistance value of the resistor based on the operating temperature to compensate for variations of a temperature biased current caused by temperature fluctuations.

In an embodiment, the serially connected transistor devices include a plurality of BJTs.

In an embodiment, the BJTs are serially connected between a temperature biased current source and a fixed voltage.

In an embodiment, the fixed voltage is ground.

In an embodiment, the driver transistor device includes a BJT.

In an embodiment, the driver transistor device is further configured to generate the drive current for an amplifier based on the resistance value of the resistor.

In an embodiment, the temperature compensation circuit further includes a substrate in which the temperature compensation circuit and the amplifier are fabricated.

In an embodiment, the substrate includes a Gallium Arsenide (GaAs) substrate.

In an embodiment, a temperature compensated amplifier circuit includes an amplifier and a temperature compensation circuit. The temperature compensation circuit includes a bias reference circuit, a driver transistor device connected to the bias reference circuit, and a substrate in which the temperature compensation circuit and the amplifier are fabricated. The bias reference circuit includes serially connected transistor devices, and at least one of the serially connected transistor devices includes a resistor connected between two terminals of the at least one of the serially connected transistor devices. The driver transistor device is configured to generate a drive current for the amplifier based on a resistance value of the resistor.

In an embodiment, the at least one of the serially connected transistor devices includes a first BJT, the resistor is connected between a base terminal of the first BJT and a collector terminal of the first BJT, and the amplifier includes a second BJT.

In an embodiment, the bias reference circuit further includes a controller configured to control a resistance value of the resistor based on an operating temperature of the temperature compensated amplifier circuit to compensate for variations of a temperature biased current caused by temperature fluctuations.

In an embodiment, the serially connected transistor devices include BJTs.

In an embodiment, the BJTs are serially connected between a temperature biased current source and a fixed voltage.

In an embodiment, the driver transistor device includes a second BJT.

In an embodiment, a temperature compensation circuit includes a bias reference circuit and a driver transistor device connected to the bias reference circuit. The bias reference circuit includes first and second transistor devices that are serially connected. The first transistor device includes a first BJT and a first resistor connected between base and collector terminals of the first BJT. The second transistor device includes a second BJT and a second resistor connected between base and collector terminals of the second BJT. The driver transistor device is configured to generate a drive current based on resistance values of the first and second resistors.

In an embodiment, the first and second BJTs are serially connected between a temperature biased current source and a fixed voltage.

In an embodiment, the bias reference circuit further includes a controller configured to control resistance values of the first and second resistors based on an operating temperature to compensate for variations of a temperature biased current of the temperature biased current source caused by temperature fluctuations.

Other aspects in accordance with the invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Figure 1:
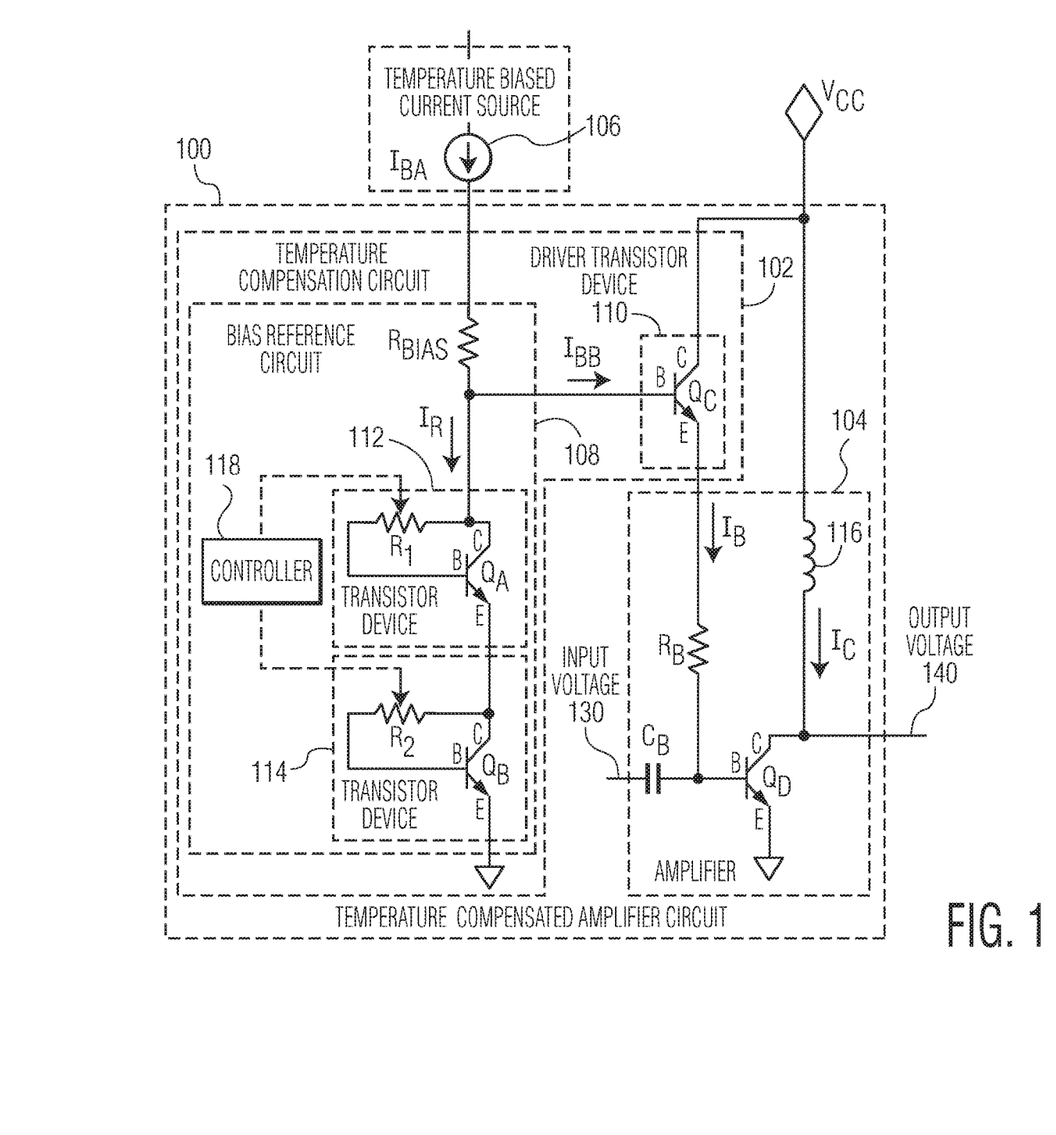
FIG. 1 is a schematic block diagram of a temperature compensated amplifier circuit in accordance with an embodiment of the invention.

FIG. 1 is a schematic block diagram of a temperature compensated amplifier circuit 100 in accordance with an embodiment of the invention. The temperature compensated amplifier circuit 100 can be used to implement signal amplification across a wide range of temperatures (e.g., from −40° C. to +105° C., which is the typical operating temperature range for electrical circuits). For example, the temperature compensated amplifier circuit 100 can maintain a constant amplification gain across a wide range of temperatures. In the embodiment depicted in FIG. 1, the temperature compensated amplifier circuit 100 includes a temperature compensation circuit 102 and an amplifier 104. In the embodiment depicted in FIG. 1, the temperature compensation circuit 102 is electrically connected to a temperature biased current source 106, whose output current, "$I_{BA}$," is temperature dependent. In some embodiments, instead of the temperature biased current source 106, a resistor that is connected to a certain voltage is used to generate the temperature bias/dependent current, $I_{BA}$.

The temperature compensated amplifier circuit 100 can be used in various applications, such as communications applications, automotive applications, industrial applications, medical applications, computer applications, and/or consumer or appliance applications. For example, the temperature compensated amplifier circuit 100 can be used in a multiple-input, multiple-output (MIMO) communications device. In some embodiments, the temperature compensated amplifier circuit is incorporated in a Massive MIMO (mMIMO) communications device.

In some embodiments, the temperature compensated amplifier circuit 100 is implemented in a substrate and is packaged as a stand-alone semiconductor Integrated Circuit (IC) device or chip. In these embodiments, the temperature compensation circuit 102 and the amplifier 104 are fabricated in the same substrate (e.g., monolithically formed in the same semiconductor die) and are packaged together as a stand-alone semiconductor IC device or chip. Examples of the substrate include, without being limited to, a semiconductor die, although embodiments of the invention alternatively may be implemented on a printed circuit board (PCB). In some embodiments, the temperature compensated amplifier circuit 100 and the temperature biased current source 106 are in different substrates and are fabricated on separate semiconductor IC devices or chips. More specifically, the temperature compensation circuit 102 and the amplifier 104 (including an RF transistor which is to be biased) may be fabricated on a first type of semiconductor substrate, and the temperature biased current source 106 may be fabricated on a second and different type of semiconductor substrate. For example, the temperature compensation circuit 102 and the amplifier 104 may be fabricated in a single Gallium Arsenide (GaAs) die, while the temperature biased current source 106 may be fabricated in a separate Silicon-Germanium (SiGe) die.

In some embodiments, the temperature compensated amplifier circuit 100 is included in a computing device, such as a smartphone, a tablet computer, a laptop, etc. Although the temperature compensated amplifier circuit 100 is shown in FIG. 1 as including certain circuit elements, in other embodiments, the temperature compensated amplifier circuit 100 may include one or more additional circuit elements. For example, the temperature compensated amplifier circuit 100 may include the temperature biased current source 106 whose output current, $I_{BA}$, is temperature dependent.

In the embodiment depicted in FIG. 1, the temperature compensation circuit 102 includes a bias reference circuit 108 and a driver transistor device 110 connected to the bias reference circuit. The temperature compensation circuit 102 is configured to compensate for the variations of one or more operating parameters of the temperature compensated amplifier circuit 100, which may be caused by temperature fluctuations. The temperature compensation circuit 102 can compensate for the variations of one or more operating parameters of the temperature compensated amplifier circuit 100 caused by temperature fluctuations with various compensation levels, for example, from no temperature compensation to full temperature compensation (e.g., constant amplifier gain for the amplifier 104 across a wide range of temperatures (e.g., from −40° C. to +105° C., which is the typical operating temperature range for electrical circuits)). In the embodiment depicted in FIG. 1, the temperature compensation circuit 102 is configured to compensate for the variations of the current, $I_{BA}$, of the temperature biased current source 106 caused by temperature fluctuations. In some embodiments, the temperature biased current source 106 is a proportional to absolute temperature (PTAT) current source whose output current, $I_{BA}$, at a specific temperature is proportional to the current at a reference temperature. For example, the output current, $I_{BA}$, of the temperature biased current source 106 at a specific temperature, T, can be expressed as:

$$I_{BA}(T) = \frac{I_o \cdot T}{3 \cdot 98} + I_o \cdot \left(1 - \frac{27}{3 \cdot 98}\right), \quad (1)$$

where $T$ = temperature, ° C., (2)

$I_o$ = current $I_{BA}$ @27° C., (3)

In some embodiments, the temperature biased current source 106 is a SiGe based current source, although the temperature biased current source 106 may be another type of current source, in other embodiments. For example, the temperature biased current source 106 is a SiGe based current source that is a component of an mMIMO communications device. In some embodiments, the temperature biased current source 106 is turned on or off according to time division duplexing (TDD) signalling. Although the temperature compensation circuit 102 is used for amplifier temperature compensation in the embodiment depicted in FIG. 1, in other embodiments, the temperature compensation circuit 102 is used to compensate for temperature-based variations of one or more operating parameters of other circuits.

In the embodiment depicted in FIG. 1, the bias reference circuit 108 includes two serially connected transistor devices 112, 114, and an optional resistor, "$R_{Bias}$." In the bias reference circuit 108 depicted in FIG. 1, the transistor device 112 includes a bipolar junction transistor (BJT), "$Q_A$," and a resistor, "$R_1$," connected between the base terminal, "B," of the BJT, $Q_A$, and the collector terminal, "C", of the BJT, $Q_A$, and the transistor device 114 includes a BJT, "$Q_B$," and a resistor, "$R_2$," connected between the base terminal, B, of the BJT, $Q_B$, and the collector terminal, C, of the BJT, $Q_B$. In some embodiments, only one of the transistor devices 112, 114 includes a resistor that is connected between two terminals (e.g., the base and collector terminals) of the BJT, $Q_A$ or $Q_B$. In one example, the transistor device 112 includes the resistor, $R_1$, which is connected between the base terminal, B, of the BJT, $Q_A$, and the collector terminal, C, of the BJT, $Q_A$, and there is no resistor connected between the base terminal, B, of the BJT, $Q_B$, and the collector terminal, C, of the BJT, $Q_B$. In another example, there is no resistor connected between the base terminal, B, of the BJT, $Q_A$, and the collector terminal, C, of the BJT, $Q_A$, and the transistor device 114 includes the resistor, $R_2$, connected between the base terminal, B, of the BJT, $Q_B$, and the collector terminal, C, of the BJT, $Q_B$ In the embodiment depicted in FIG. 1, the emitter terminal, "E," of the BJT, $Q_A$, is electrically connected to the collector terminal, C, of the BJT, $Q_B$, and the emitter terminal, E, of the BJT, $Q_B$, is electrically connected to a reference voltage, e.g., ground. Although the transistor devices 112, 114 of the bias reference circuit 108 are implemented using NPN transistors (i.e., the BJTs, $Q_A$, $Q_B$, being NPN transistors) in the embodiment depicted in FIG. 1, in other embodiments, the transistor devices 112, 114 are implemented using PNP transistors, heterojunction bipolar transistors (HBTs), and/or a combination of one or more NPN transistors, PNP transistors, and/or HBTs.

In the embodiment depicted in FIG. 1, the driver transistor device 110 is electrically connected to the bias reference circuit 108 such that a current, $I_{BB}$, flows into the driver transistor device from the bias reference circuit. In some embodiments, the driver transistor device 110 is configured to generate a drive current, "$I_B$," based on the resistance values of the resistor, $R_1$, and the resistance value of the resistor, $R_2$, and the current, $I_{BA}$. In embodiments where only one of the transistor devices 112, 114 includes a resistor that is connected between two terminals (e.g., the base and collector terminals) of the BJT, $Q_A$, or, $Q_B$ the driver transistor device 110 is configured to generate the drive current based on the resistance value of the resistor, $R_1$, or the resistance value of the resistor, $R_2$, and the current, $I_{BA}$. The driver transistor device 110 can be implemented using one or more BJTs and/or metal oxide semiconductor (MOS) transistors. In the temperature compensated amplifier circuit 100 depicted in FIG. 1, the driver transistor device 110 includes a BJT, "$Q_C$." In the embodiment depicted in FIG. 1, the base terminal, B, of the BJT, $Q_C$, is electrically connected to the collector terminal, C, of the BJT, $Q_A$, to the resistor, $R_{Bias}$, and to the resistor, $R_1$. The collector terminal, C, of the BJT, $Q_C$, is electrically connected to a positive voltage, "Vcc." In some embodiments, the BJT, $Q_C$, is configured as an emitter follower to drive the drive current, $I_B$, into the amplifier 104.

In the embodiment depicted in FIG. 1, the amplifier 104 is electrically connected to the driver transistor device 110 and is driven by the current, $I_B$, which is generated by the driver transistor device. The amplifier 104 can include a transistor, $Q_D$, that is implemented using one or more BJTs, such as NPN transistors, PNP transistors, and/or HBTs, and/or MOS transistors. In the embodiment depicted in FIG. 1, the amplifier includes a BJT, "$Q_D$," a resistor, "$R_B$," a capacitor, "$C_B$," and an optional inductance 116, which can also include a transmission line. In some embodiments, instead of the optional inductance 116, the amplifier 104 includes a resistor or a transistor electrically connected between the driver transistor device 110 and the amplifier 104. The BJT, $Q_D$, may be a GaAs HBT or other type of BJT. In some embodiments, the amplifier 104 amplifies an input voltage 130, which is applied to the base terminal, B, of the BJT, $Q_D$, through the capacitor, $C_B$, into an output voltage 140, which is output from the collector terminal, C, of the BJT, $Q_D$. In some embodiments, the resistor, $R_B$, is a ballast resistor with a constant resistance value, which provides a direct current (DC) path to electrically couple the current, $I_B$, to the base terminal, B, of the BJT, $Q_D$, and serves as a ballast to prevent thermal run away when the BJT, $Q_D$, is composed of multiple transistor cells. In some embodiments, instead of the resistor, $R_B$, an inductor is connected between the collector terminal, C, of the BJT, $Q_C$, and the base terminal, B, of the BJT, $Q_D$. In some embodiments, the capacitor, $C_B$, is a ballast capacitor with a constant capacitance value, which allows the input voltage 130 to pass through the capacitor, $C_B$, and to be applied to the base terminal, B, of the BJT, $Q_D$, and blocks the current, $I_B$, from flowing into the input voltage. In the embodiment depicted in FIG. 1, the base terminal, B, of the BJT, $Q_D$, is electrically connected to the resistor, $R_B$, and to the capacitor, $C_B$. The collector terminal, C, of the BJT, $Q_D$, is electrically connected to the positive voltage, Vcc. The emitter terminal, E, of the BJT, $Q_D$, is electrically connected to a reference voltage, e.g., ground.

In the embodiment depicted in FIG. 1, the resistance value of the resistor, $R_1$, of the transistor device 112 of the bias reference circuit 108 and/or the resistance value of the resistor, $R_2$, of the transistor device 114 of the bias reference circuit is/are set to compensate the gain variation of the BJT, $Q_D$, caused by temperature fluctuations. In some embodiments, a profile of the current, $I_B$, versus temperature is created and stored in the temperature compensation circuit 102 (e.g., as a look-up table), which can be used to obtain a constant amplification gain for the BJT, $Q_D$. The resistor, $R_1$, and the resistor, $R_2$, may be implemented as any type of variable resistors that are known in the art. In some embodiments, the resistor, $R_1$, and the resistor, $R_2$, are resistor ladders. In some embodiments, the resistance value of the resistor, $R_1$, and/or the resistance value of the resistor, $R_2$, is/are fixed after device fabrication.

In some embodiments, the temperature compensation circuit 102 (e.g., more specifically the bias reference circuit 108) includes at least one controller 118 configured to set and/or adjust the resistance value of the variable resistor, $R_1$, and/or the resistance value of the variable resistor, $R_2$, based on an operating temperature of the temperature compensated amplifier circuit 100. For example, the controller 118 is configured to set and/or adjust the resistance value of the resistor, $R_1$, and/or the resistance value of the resistor, $R_2$, based on the current operating temperature of the temperature compensated amplifier circuit 100 to compensate for the variations of the current, $I_{BA}$, of the temperature biased current source 106 caused by temperature fluctuations. The controller 118 can be implemented using a processor, which can be implemented using hardware, software, firmware, and/or a combination of hardware, software, and firmware. Examples of the controller 118 include, without being limited to, a microcontroller, a central processing units (CPU) and an Application-Specific Integrated Circuit (ASIC). In some embodiments, the controller 118 includes a temperature sensor or has access to a temperature sensor.

In some embodiments, predetermined resistance values of the resistor, $R_1$, and/or the resistance value of the resistor, $R_2$, at specific temperature levels are stored in a look-up table within the controller 118. For example, as the resistance of the resistor, $R_1$, increases, the voltage between the collector terminal, C, and the base terminal, B, of the BJT, $Q_A$, increases because more base current flows into the BJT, $Q_A$. As a function of the operating temperature, the current through the resistor, $R_1$, increases, leading to an increase in the collector voltage of the BJT, $Q_A$, thereby causing the current, $I_R$, flowing into the BJT, $Q_A$, to decrease and the current, $I_{BB}$, flowing into the BJT, $Q_C$, to increase. Further, the current, $I_B$, is proportional to the current, $I_{BB}$, and as the current, $I_{BB}$, increases with increasing temperature, the current, $I_B$, also increases, which leads to a gain increase in the BJT, $Q_D$. The larger the resistance value of the resistor, $R_1$, the larger the current, $I_{BB}$, flowing into the BJT, $Q_C$, increases with increasing temperature. The resistor, $R_2$, and the BJT, $Q_B$, operate similarly as the resistance value of the resistor, $R_2$, increases. In some embodiments, the resistance value of the resistor, $R_1$, and the resistance value of the resistor, $R_2$, are determined through circuit simulation, for example, by observing a simulated response of amplifier gain versus temperature.

In an embodiment, the controller 118 has the flexibility to implement a continuum of bias temperature profiles, which can be applied to the amplifier to yield various compensation levels, for example, from no temperature compensation to full temperature compensation ((i.e., constant amplifier gain for the amplifier across a temperature range (e.g., from −40° C. to +105° C.)). For example, the controller 118 may set the resistance value of the resistor, $R_1$, and the resistance value of the resistor, $R_2$, to achieve a desired temperature profile for currents $I_R$, $I_{BB}$, $I_B$, and $I_C$, in the temperature compensated amplifier circuit 100 to improve the performance of the amplifier 104, such as to reduce the gain variation of the amplifier as a function of the operating temperature.

In some embodiments, the value of the current, $I_R$, flowing into the BJT, $Q_A$, is dependent on the resistance values of the resistors, $R_1$ and $R_2$, and the temperature dependence of the current, $I_R$, is a function of the resistance values of the resistors, $R_1$ and $R_2$. In the embodiment depicted in FIG. 1, the current, $I_B$, flowing from the emitter terminal, E, of the BJT, $Q_C$, is the difference between the current, $I_{BA}$, of the temperature biased current source 106 and the current, $I_R$. Consequently, the temperature dependence of the current, $I_R$, can be used to determine temperature profiles of the current, $I_C$, flowing into the collector terminal, C, of the BJT, $Q_D$.

Figure 2:
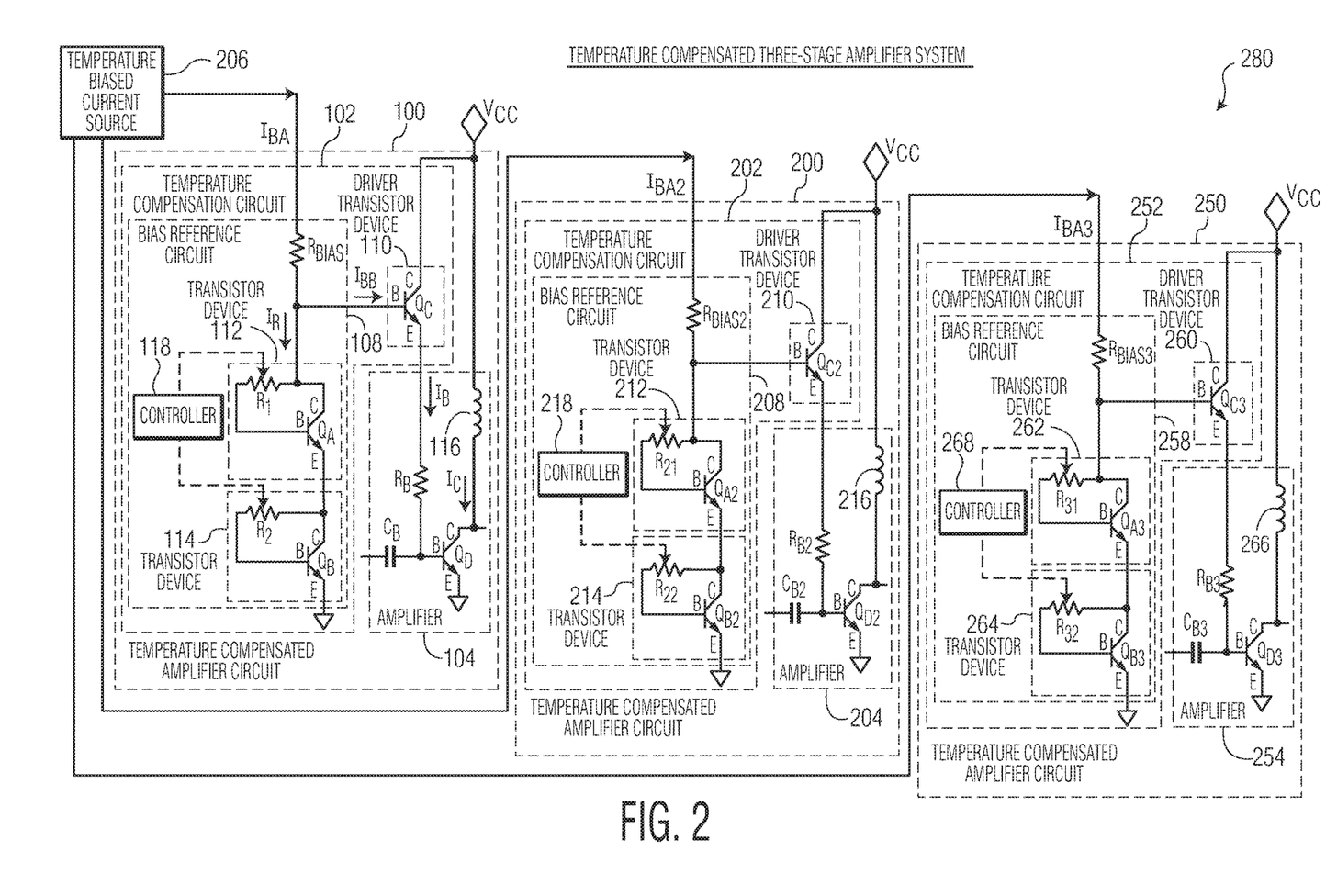
FIG. 2 is a schematic block diagram of a temperature compensated three-stage amplifier system in accordance with an embodiment of the invention.

In some embodiments, multiple temperature compensated amplifiers are used within an amplifier system to increase signal amplification. FIG. 2 is a schematic block diagram of a temperature compensated three-stage amplifier system 280 in accordance with an embodiment of the invention. In the embodiment depicted in FIG. 2, the temperature compensated three-stage amplifier system includes the temperature compensated amplifier circuit 100 as a first-stage amplifier, a second-stage temperature compensated amplifier circuit 200, a third-stage temperature compensated amplifier circuit 250, and a temperature biased current source 206 configured to generate temperature biased currents, $I_{BA}$, $I_{BA2}$, and $I_{BA3}$, which may have unique current values and/or share some common current values. The second-stage temperature compensated amplifier circuit 200 and the third-stage temperature compensated amplifier circuit 250 depicted in FIG. 2 are similar to or the same as the temperature compensated amplifier circuit 100 depicted in FIG. 1.

The temperature compensated amplifier circuits 100, 200, 300 may be fabricated on a first type of semiconductor substrate, and the temperature biased current source 206 may be fabricated on a second and different type of semiconductor substrate. For example, the temperature compensated amplifier circuits 100, 200, 300 may be fabricated in a single GaAs die or in multiple GaAs dies, while the temperature biased current source 206 may be fabricated in one or more separate SiGe dies. Again, the temperature biased current source 206 may include multiple PTAT current sources whose output currents, $I_{BA}$, $I_{BA2}$, and $I_{BA3}$, at a specific temperature are proportional to the currents at a reference temperature.

In the embodiment depicted in FIG. 2, the second-stage temperature compensated amplifier circuit 200 includes a temperature compensation circuit 202, which includes a bias reference circuit 208 and a driver transistor device 210, and an amplifier 204, which includes a BJT, "$Q_{D2}$," a resistor, "$R_{B2}$," a capacitor, "$C_{B2}$," and an optional inductance 216. The bias reference circuit 208 includes a transistor device 212, which includes a BJT, "$Q_{A2}$," and a resistor, "$R_{21}$," a transistor device 214, which includes a BJT, "$Q_{B2}$," and a resistor, "$R_{22}$," a controller 218, and an optional resistor, "$R_{Bias2}$." The driver transistor device 210 includes a BJT, "$Q_{C2}$."

In the embodiment depicted in FIG. 2, the third-stage temperature compensated amplifier circuit 250 includes a temperature compensation circuit 252, which includes a bias reference circuit 258 and a driver transistor device 260, and an amplifier 254, which includes a BJT, "$Q_{D3}$," a resistor, "$R_{B3}$," a capacitor, "$C_{B3}$," and an optional inductance 266. The bias reference circuit 258 includes a transistor device 262, which includes a BJT, "$Q_{A3}$," and a resistor, "$R_{31}$," a transistor device 264, which includes a BJT, "$Q_{B3}$," and a resistor, "$R_{32}$," a controller 268, and an optional resistor, "$R_{Bias3}$." The driver transistor device 260 includes a BJT, "$Q_{C3}$."

Figure 3:
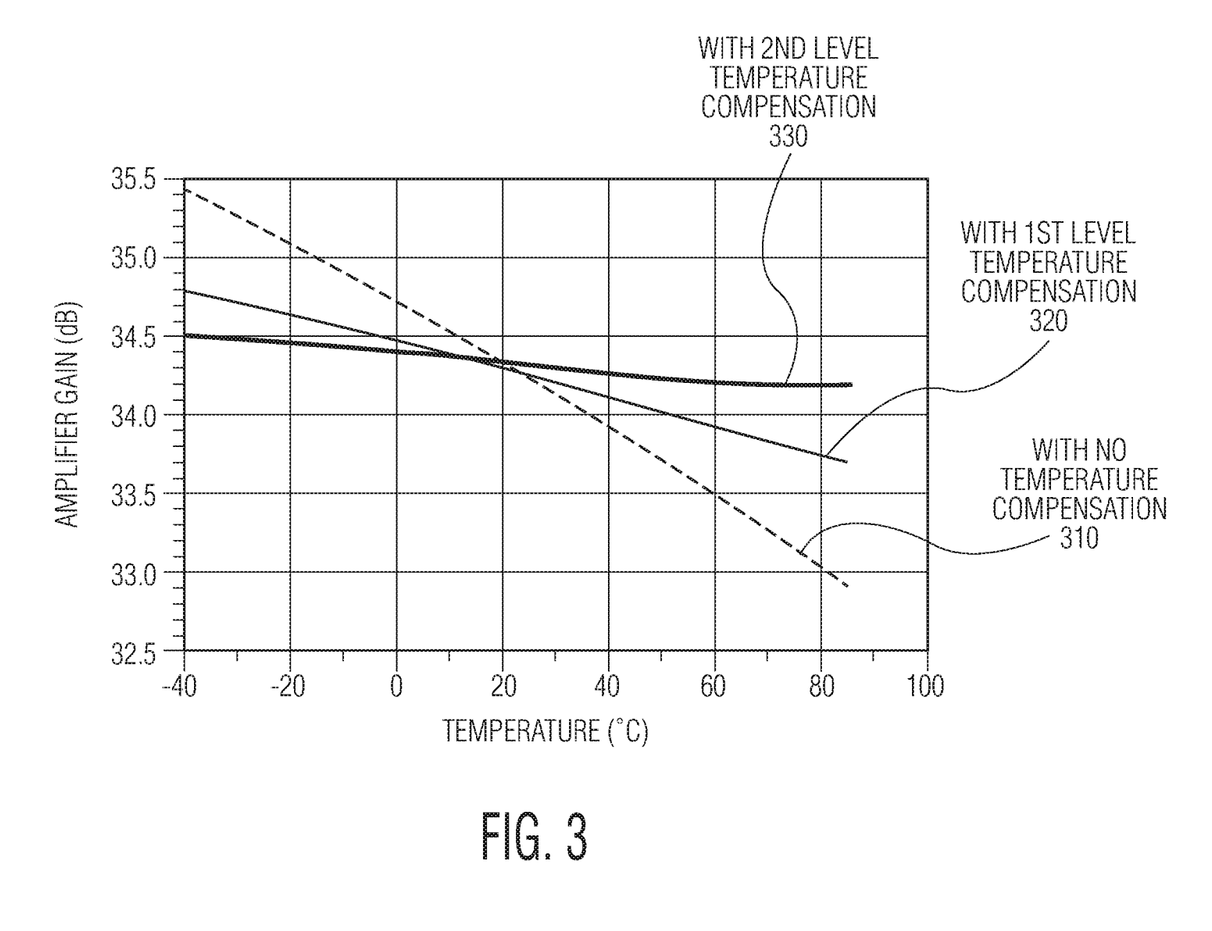
FIG. 3 is a graph of amplifier gain versus temperature for the temperature compensated three-stage amplifier system depicted in FIG. 2.

FIG. 3 is a graph of amplifier gain versus temperature for the temperature compensated three-stage amplifier system 280 depicted in FIG. 2 that are generated from simulation results. In FIG. 3, curve 310 represents the amplifier gain of the temperature compensated three-stage amplifier system with no temperature compensation, curve 320 represents the amplifier gain of the temperature compensated three-stage amplifier system with a first level of temperature compensation, and curve 330 represents the amplifier gain of the temperature compensated three-stage amplifier system with a second level of temperature compensation, which can better compensate for temperature-based amplifier gain variation than the first level of temperature compensation. When no temperature compensation is applied, the amplifier gain of the temperature compensated three-stage amplifier system decreases rapidly when temperature increases. When the first level of temperature compensation is applied, the amplifier gain of the temperature compensated three-stage amplifier system decreases less rapidly when temperature increases. When the second level of temperature compensation is applied, the amplifier gain of the temperature compensated three-stage amplifier system is almost constant when temperature increases.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program. The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments which use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A temperature compensation circuit comprising:
    a bias reference circuit, wherein the bias reference circuit comprises a plurality of serially connected transistor devices, wherein at least one of the serially connected transistor devices comprises a resistor connected between two terminals of the at least one of the serially connected transistor devices, and wherein the bias reference circuit further comprises a controller configured to control a resistance value of the resistor based on an operating temperature; and
    a driver transistor device connected to the bias reference circuit and configured to generate a drive current based on a resistance value of the resistor.

2. The temperature compensation circuit of claim 1, wherein the at least one of the serially connected transistor devices comprises a bipolar junction transistor (BJT), and wherein the resistor is connected between a base terminal of the BJT and a collector terminal of the BJT.

3. The temperature compensation circuit of claim 1, wherein the controller is further configured to control the resistance value of the resistor based on the operating temperature to compensate for variations of a temperature biased current caused by temperature fluctuations.

4. The temperature compensation circuit of claim 1, wherein the serially connected transistor devices comprise a plurality of bipolar junction transistors (BJTs).

5. The temperature compensation circuit of claim 4, wherein the BJTs are serially connected between a temperature biased current source and a fixed voltage.

6. The temperature compensation circuit of claim 5, wherein the fixed voltage is ground.

7. The temperature compensation circuit of claim 1, wherein the driver transistor device comprises a bipolar junction transistor (BJT).

8. The temperature compensation circuit of claim 1, wherein the driver transistor device is further configured to generate the drive current for an amplifier based on the resistance value of the resistor.

9. The temperature compensation circuit of claim 8, further comprising a substrate in which the temperature compensation circuit and the amplifier are fabricated.

10. The temperature compensation circuit of claim 9, wherein the substrate comprises a Gallium Arsenide (GaAs) substrate.

11. A temperature compensated amplifier circuit comprising:
    an amplifier;
    a temperature compensation circuit comprising:
        a bias reference circuit, wherein the bias reference circuit comprises a plurality of serially connected transistor devices, wherein at least one of the serially connected transistor devices comprises a resistor connected between two terminals of the at least one of the serially connected transistor devices, and wherein the bias reference circuit further comprises a controller configured to control a resistance value of the resistor based on an operating temperature; and
        a driver transistor device connected to the bias reference circuit and configured to generate a drive current for the amplifier based on a resistance value of the resistor; and
    a substrate in which the temperature compensation circuit and the amplifier are fabricated.

12. The temperature compensated amplifier circuit of claim 11, wherein the at least one of the serially connected transistor devices comprises a first bipolar junction transistor (BJT), wherein the resistor is connected between a base terminal of the first BJT and a collector terminal of the first BJT, and wherein the amplifier comprises a second BJT.

13. The temperature compensated amplifier circuit of claim 11, wherein the controller is further configured to control the resistance value of the resistor based on the operating temperature of the temperature compensated amplifier circuit to compensate for variations of a temperature biased current caused by temperature fluctuations.

14. The temperature compensated amplifier circuit of claim 11, wherein the serially connected transistor devices comprise a plurality of bipolar junction transistors (BJTs).

15. The temperature compensated amplifier circuit of claim 14, wherein the BJTs are serially connected between a temperature biased current source and a fixed voltage.

16. The temperature compensated amplifier circuit of claim 14, wherein the driver transistor device comprises a second BJT.

17. A temperature compensation circuit comprising:
a bias reference circuit, wherein the bias reference circuit comprises:
first and second transistor devices that are serially connected, wherein the first transistor device comprises a first bipolar junction transistor (BJT) and a first resistor connected between base and collector terminals of the first BJT, and wherein the second transistor device comprises a second BJT and a second resistor connected between base and collector terminals of the second BJT; and
a driver transistor device connected to the bias reference circuit and configured to generate a drive current based on resistance values of the first and second resistors.

18. The temperature compensation circuit of claim 17, wherein the first and second BJTs are serially connected between a temperature biased current source and a fixed voltage.

19. The temperature compensation circuit of claim 18, wherein the bias reference circuit further comprises a controller configured to control resistance values of the first and second resistors based on an operating temperature to compensate for variations of a temperature biased current of the temperature biased current source caused by temperature fluctuations.

* * * * *